(12) United States Patent
Kim et al.

(10) Patent No.: US 11,081,205 B2
(45) Date of Patent: Aug. 3, 2021

(54) SEMICONDUCTOR APPARATUS FOR COMPENSATING FOR DEGRADATION AND SEMICONDUCTOR SYSTEM USING THE SAME

(71) Applicant: SK hynix Inc., Icheon-si (KR)

(72) Inventors: Woongrae Kim, Icheon-si (KR); Bok Rim Ko, Seoul (KR); Keun Soo Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/819,710

(22) Filed: Mar. 16, 2020

(65) Prior Publication Data

US 2020/0219583 A1    Jul. 9, 2020

Related U.S. Application Data (62) Division of application No. 15/845,343, filed on Dec. 18, 2017, now Pat. No. 10,629,287.

(30) Foreign Application Priority Data

May 2, 2017  (KR) .................... 10-2017-0056260

(51) Int. Cl.
| | | |
|---|---|---|
| *G11C 5/14* | (2006.01) | |
| *G11C 29/50* | (2006.01) | |
| *H03K 5/159* | (2006.01) | |
| *G11C 29/12* | (2006.01) | |
| *G11C 29/02* | (2006.01) | |
| *G11C 29/44* | (2006.01) | |
| *G11C 29/04* | (2006.01) | |
| *H03K 5/00* | (2006.01) | |

(52) U.S. Cl.
CPC ...... *G11C 29/50004* (2013.01); *G11C 29/021* (2013.01); *G11C 29/028* (2013.01); *G11C 29/12005* (2013.01); *H03K 5/159* (2013.01); *G11C 29/50012* (2013.01); *G11C 2029/0401* (2013.01); *G11C 2029/4402* (2013.01); *H03K 2005/00019* (2013.01)

(58) Field of Classification Search
CPC ............ G11C 29/50004; G11C 29/028; G11C 29/021; G11C 29/12005; G11C 29/50012; G11C 2029/4402; G11C 2029/0401; G11C 29/12; G11C 29/50; G11C 2029/5004
USPC .................................................... 365/189.09
See application file for complete search history.

(56) References Cited

U.S. PATENT DOCUMENTS

| | | | |
|---|---|---|---|
| 5,615,158 A * | 3/1997 | Ochoa ................. | G11C 7/065 327/52 |
| 6,313,695 B1 | 11/2001 | Ooishi et al. | |
| 8,422,303 B2 * | 4/2013 | Franca-Neto ...... | G11C 16/3418 365/185.2 |
| 2008/0175068 A1 | 7/2008 | Houston et al. | |
| 2014/0312961 A1 | 10/2014 | Sea | |
| 2015/0340081 A1 | 11/2015 | Deng et al. | |
| 2016/0247554 A1 | 8/2016 | Mojumder et al. | |

* cited by examiner

*Primary Examiner* — Tha-O H Bui
(74) *Attorney, Agent, or Firm* — William Park & Associates Ltd.

(57) ABSTRACT

A semiconductor apparatus may include a degradation detection circuit and a circuit block. The degradation detection circuit may detect a degradation occurred in a semiconductor apparatus and generate degradation information. The circuit block may include at least one transistor configured to receive a variable bias voltage and a variable gate voltage.

17 Claims, 6 Drawing Sheets

SEMICONDUCTOR APPARATUS FOR COMPENSATING FOR DEGRADATION AND SEMICONDUCTOR SYSTEM USING THE SAME

CROSS-REFERENCES TO RELATED APPLICATION

The present application is a divisional application of U.S. patent application Ser. No. 15/845,343, filed on Dec. 18, 2017, and claims priority under 35 U.S.C. § 119(a) to Korean application number 10-2017-0056260, filed on May 2, 2017, in the Korean Intellectual Property Office, which is incorporated herein by reference in its entirety.

BACKGROUND

1. Technical Field

Various embodiments generally relate to a semiconductor technology, and, more particularly, to a semiconductor apparatus and a semiconductor system.

2. Related Art

A semiconductor apparatus may be designed and manufactured to include a myriad of semiconductor devices. The semiconductor devices may degrade as time passes, and the operational characteristics of the semiconductor devices may vary as degradation increases. Representative degradation phenomena occurring in the semiconductor devices may include HCI (hot carrier injection), TDDB (time-dependent dielectric breakdown) and BTI (bias temperature instability). Among these phenomena, the BTI may change the threshold voltage of a transistor to change the operation characteristic of the transistor, and may deteriorate the performance of the semiconductor apparatus. As the BTI, NBTI (negative bias temperature instability) mainly occurring in a P-channel MOS transistor and PBTI (positive bias temperature instability) mainly occurring in an N-channel MOS transistor may exist. The NBTI and PBTI have a close relation with the performance and reliability of the semiconductor apparatus.

SUMMARY

In an embodiment, a semiconductor apparatus may include a degradation detection circuit configured for detecting degradation that has occurred in a semiconductor apparatus and generating degradation information. The semiconductor apparatus may include a voltage generator configured for generating a variable bias voltage and a variable gate voltage based on the degradation information. The semiconductor apparatus may include a circuit block including at least one transistor, the at least one transistor configured to operate by receiving the variable bias voltage and the variable gate voltage.

In an embodiment, a semiconductor system may include a memory apparatus configured for detecting degradation that has occurred in the memory apparatus and generating degradation information based on a training command, and generating a variable bias voltage and a variable gate voltage based on a voltage setting command. The semiconductor system may include a memory controller configured for providing the training command to the memory apparatus, and generating the voltage setting command based on the degradation information.

In an embodiment, a semiconductor system may include a memory apparatus including a plurality of ranks, and generating degradation information by detecting degradation that has occurred in the plurality of ranks based on a training command. The semiconductor system may include a memory controller configured for performing memory mapping by mapping a rank which is degraded more than a reference value among the plurality of ranks with a rank which is degraded less than the reference value among the plurality of ranks, based on the degradation information.

In an embodiment, a semiconductor apparatus may be provided. The semiconductor apparatus may include a circuit block including at least one transistor configured to receive a variable bias voltage and a variable gate voltage. The semiconductor apparatus may include a degradation detection circuit configured to compensate for a variation in a threshold voltage of the at least one transistor by generating degradation information to change levels of the variable bias voltage and the variable gate voltage being received by the at least one transistor.

DETAILED DESCRIPTION

Hereinafter, a semiconductor apparatus for compensating for degradation and a semiconductor system using the same will be described below with reference to the accompanying drawings through various examples of embodiments.

Figure 1:
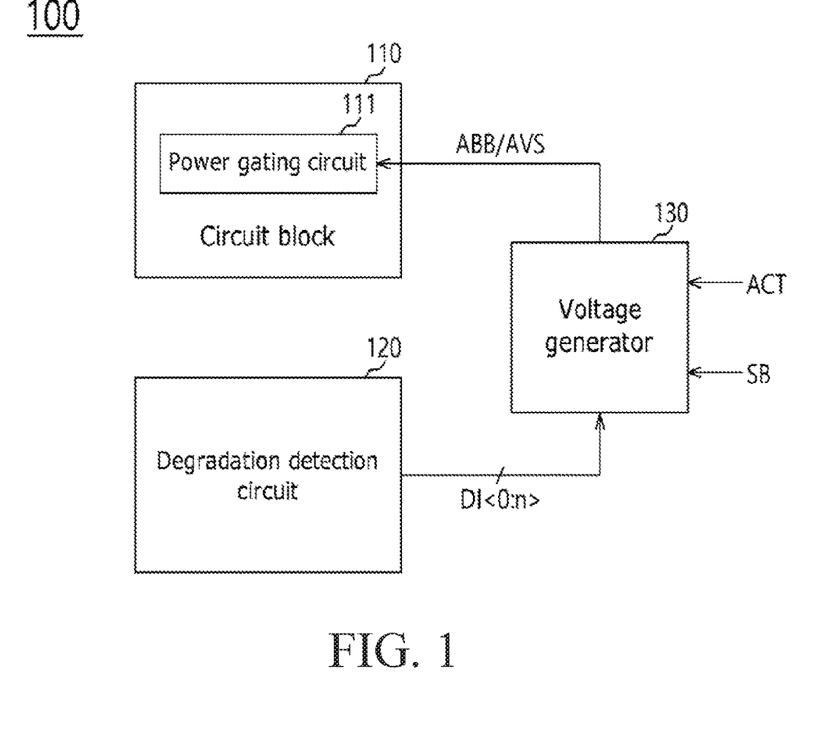
FIG. 1 is a diagram illustrating a representation of an example of the configuration of a semiconductor apparatus in accordance with an embodiment.

FIG. 1 is a diagram illustrating a representation of an example of the configuration of a semiconductor apparatus 100 in accordance with an embodiment. Referring to FIG. 1, the semiconductor apparatus 100 may include a circuit block 110 which includes a plurality of transistors, and may detect a degradation occurred in the semiconductor apparatus 100 and change a bias voltage and a gate voltage to be applied to at least one of the plurality of transistors. Referring to FIG. 1, the semiconductor apparatus 100 may include a degradation detection circuit 120, a voltage generator 130 and the circuit block 110. The degradation detection circuit 120 may detect a degradation occurred in the semiconductor apparatus 100. For example, the degradation detection circuit 120 may detect degradation relating to BTI (bias temperature instability). The degradation detection circuit 120 may detect degradation occurring in the semiconductor apparatus 100 and generate degradation information DI<0:n> based on a degradation detection result. For example, the degradation information DI<0:n> may be a code signal which includes a plurality of bits, and may have a different logic value depending on the degree of degradation.

The voltage generator 130 may receive the degradation information DI<0:n> and generate a variable bias voltage ABB and a variable gate voltage AVS. The voltage generator 130 may change the levels of the variable bias voltage ABB and the variable gate voltage AVS based on the degradation information DI<0:n>. For example, the voltage generator 130 may raise or lower the levels of the variable bias voltage ABB and the variable gate voltage AVS based on the degradation information DI<0:n>. In an embodiment, an amount of change of the variable bias voltage ABB may be larger than an amount of change of the variable gate voltage AVS. For example, a unit amount of change of the variable bias voltage ABB may be larger than a unit amount of change of the variable gate voltage AVS.

The circuit block 110 may include various logic circuits. The logic circuits may be any circuits capable of performing various calculations and functions and configuring the semiconductor apparatus 100. The circuit block 110 may include a power gating circuit 111. The power gating circuit 111 may control application of a power supply voltage to a logic circuit configuring the circuit block 110. The semiconductor apparatus 100 may perform an active operation and a standby operation. The active operation may mean an active mode in which the semiconductor apparatus 100 may perform normal operations and thereby perform various functions, and the standby operation may mean a sleep mode in which the semiconductor apparatus 100 may minimize power consumption. The sleep mode may include any low power operation mode such as a power-down mode and a deep power-down mode. The power gating circuit 111 may apply the power supply voltage to the logic circuit in the active operation of the semiconductor apparatus 100, and may cut off the application of the power supply voltage to the logic circuit in the standby operation of the semiconductor apparatus 100. As will be described later, the power gating circuit 111 may receive the variable bias voltage ABB and the variable gate voltage AVS. The power gating circuit 111 may include at least one sleep transistor which is coupled between the terminal of the power supply voltage and the logic circuit. The variable bias voltage ABB may be applied to the body of the sleep transistor, and the variable gate voltage AVS may be applied to the gate of the sleep transistor.

The voltage generator 130 may additionally receive an active signal ACT and a standby signal SB. The active signal ACT is a signal which may be enabled during the active operation of the semiconductor apparatus 100, and the standby signal SB may be a signal which may be enabled during the standby operation of the semiconductor apparatus 100. In an embodiment, one signal may be used instead of the active signal ACT and the standby signal SB. For example, one signal may be enabled during the active operation of the semiconductor apparatus 100 and be disabled during the standby operation of the semiconductor apparatus 100. The voltage generator 130 may generate the variable bias voltage ABB having a first level and the variable gate voltage AVS having a second level based on the active signal ACT such that the sleep transistor of the power gating circuit 111 may be turned on during the active operation of the semiconductor apparatus 100 and thus the power supply voltage may be applied to the logic circuit. The voltage generator 130 may generate the variable bias voltage ABB having a third level and the variable gate voltage AVS having a fourth level based on the standby signal SB such that the sleep transistor of the power gating circuit 111 may be turned off during the standby operation of the semiconductor apparatus 100 and thus the power supply voltage may not be applied to the logic circuit. The voltage generator 130 may change the levels of the variable bias voltage ABB having the third level and the variable gate voltage AVS having the fourth level based on the degradation information DI<0:n>. The first to fourth levels may be levels which a designer may set based the kind and/or characteristic of the sleep transistor configuring the power gating circuit 111.

Figure 2:
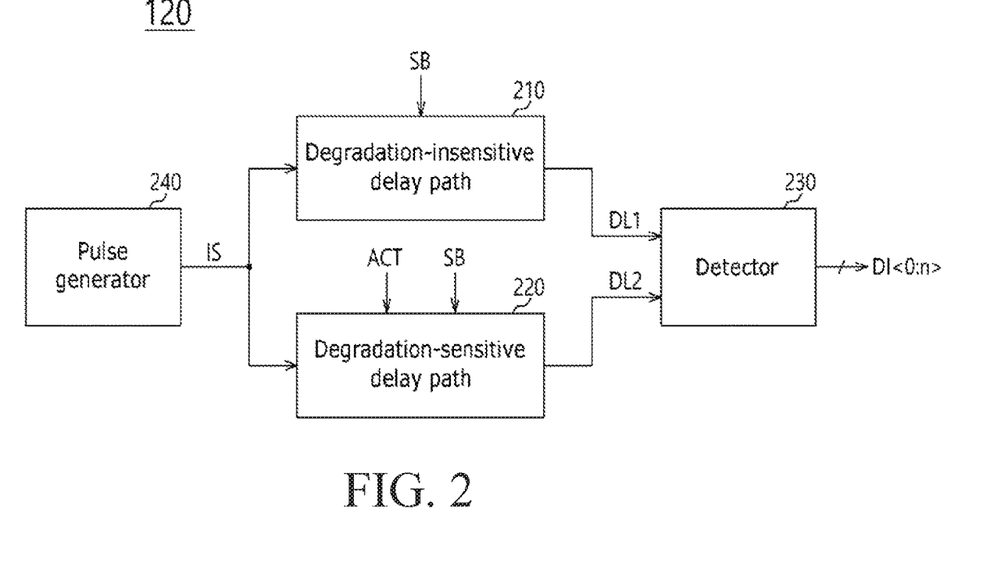
FIG. 2 is a diagram illustrating a representation of an example of the configuration of the degradation detection circuit illustrated in FIG. 1.

FIG. 2 is a diagram illustrating a representation of an example of the configuration of the degradation detection circuit 120 illustrated in FIG. 1. Referring to FIG. 2, the degradation detection circuit 120 may include a degradation-insensitive delay path 210, a degradation-sensitive delay path 220 and a detector 230. The degradation-insensitive delay path 210 may receive a pulse signal IS, delay the pulse signal IS and generate a first delayed signal DL1. The degradation-insensitive delay path 210 may have a delay amount on which an influence of degradation that has occurred in the semiconductor apparatus 100 is reflected a relatively small amount and an influence according to a variation in the process, temperature, and voltage of the semiconductor apparatus 100 is reflected a relatively large amount. Therefore, the degradation-insensitive delay path 210 may generate the first delayed signal DL1 by delaying the pulse signal IS by a delay amount according to a variation in the process, temperature and voltage of the semiconductor apparatus 100. The degradation-insensitive delay path 210 may receive the standby signal SB. While not illustrated, the degradation-insensitive delay path 210 may include an inverter chain which includes a plurality of inverters. The inverter chain may be turned on when the standby signal SB is in an enabled state. Thus, since the degradation-insensitive delay path 210 may be turned off during the active operation of the semiconductor apparatus 100 and be turned on during the standby operation of the semiconductor apparatus 100, the degradation-insensitive delay path 210 may be influenced a relatively small amount by degradation that has occurred in the semiconductor apparatus 100.

The degradation-sensitive delay path 220 may receive the pulse signal IS, delay the pulse signal IS and generate a second delayed signal DL2. The degradation-sensitive delay path 220 may have a delay amount on which both an influence of degradation that has occurred in the semiconductor apparatus 100 and an influence according to a variation in the process, temperature and voltage of the semiconductor apparatus 100 are reflected. The degradation-sensitive delay path 220 may generate the second delayed signal DL2 by delaying the pulse signal IS by a delay amount according to a variation in the process, temperature and voltage of the semiconductor apparatus 100 and by the degradation that has occurred in the semiconductor apparatus 100. The degradation-sensitive delay path 220 may receive both the active signal ACT and the standby signal SB. While not illustrated, the degradation-sensitive delay path 220 may include an inverter chain which has the same configuration as the degradation-insensitive delay path 210. The inverter chain may be turned on when the active signal ACT is in an enabled state or the standby signal SB is in an enabled state. Thus, since the degradation-sensitive delay path 220 is turned on during both the active operation and the standby operation of the semiconductor apparatus 100, the degradation-sensitive delay path 220 may be influenced by a relatively greater amount due to degradation that has occurred in the semiconductor apparatus 100. In an embodiment, for example, the degradation-sensitive delay path 220 is turned on during both the active operation and the standby operation of the semiconductor apparatus 100 and thus the degradation-sensitive delay path 220 is influenced relatively more from degradation, that has occurred in the semiconductor apparatus 100, than the influence of the degradation by the semiconductor apparatus 100 on the degradation-insensitive delay path 210 because the degradation-insensitive delay path 210 is turned on during the standby operation of the semiconductor apparatus 100.

The detector 230 may receive the first and second delayed signals DL1 and DL2 and generate the degradation information DI<0:n>. The detector 230 may detect the phase difference between the first and second delayed signals DL1 and DL2 and generate the degradation information DI<0:n> which has a logic value corresponding to the phase difference. Since the degradation-insensitive delay path 210 and the degradation-sensitive delay path 220 are influenced in common by a variation in the process, temperature and voltage of the semiconductor apparatus 100, the phase difference between the first and second delayed signals DL1 and DL2 may vary depending on a degradation occurred in the semiconductor apparatus 100. The phase difference may increase as degradation that has occurred in the semiconductor apparatus 100 becomes larger and decrease as the degradation that has occurred in the semiconductor apparatus 100 is reduced. For example, the detector 230 may generate the degradation information DI<0:n> having a high value when the phase difference is large, and may generate the degradation information DI<0:n> having a low value when the phase difference is small. The degradation detection circuit 120 may further include a pulse generator 240. The pulse generator 240 may generate the pulse signal IS. The pulse generator 240 may generate the pulse signal IS when the degradation detection circuit 120 performs a degradation detecting operation. For example, the pulse generator 240 may generate the pulse signal IS during the standby operation of the semiconductor apparatus 100. In an embodiment, the pulse generator 240 may generate the pulse signal IS based on the standby signal SB during the standby operation of the semiconductor apparatus 100. The pulse generator 240 may generate the pulse signal IS based on a signal related with a training operation during the training operation of the semiconductor apparatus 100. Descriptions for the training operation will be made later.

Figure 3:
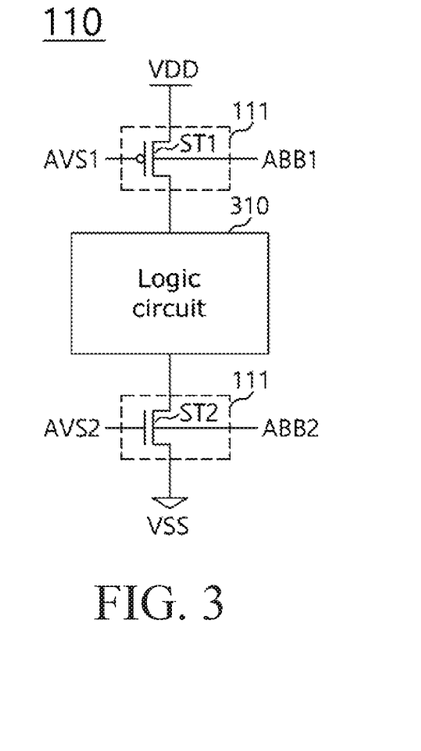
FIG. 3 is a diagram illustrating a representation of an example of the configuration of the circuit block illustrated in FIG. 1.

FIG. 3 is a diagram illustrating a representation of an example of the configuration of the circuit block 110 illustrated in FIG. 1. Referring to FIG. 3, the circuit block 110 may include a logic circuit 310 and the power gating circuit 111. The power gating circuit 111 may include at least one of a first sleep transistor ST1 and a second sleep transistor ST2. The variable bias voltage ABB may include a first variable bias voltage ABB1 and a second variable bias voltage ABB2, and the variable gate voltage AVS may include a first variable gate voltage AVS1 and a second variable gate voltage AVS2. The first sleep transistor ST1 may be coupled between a first power supply voltage VDD and the logic circuit 310. The first power supply voltage VDD may be a high voltage. For example, the first power supply voltage VDD may be a power supply voltage appropriate for the semiconductor apparatus 100 to operate. The first sleep transistor ST1 may be a P-channel MOS transistor. The source of the first sleep transistor ST1 may be coupled with the terminal of the first power supply voltage VDD, and the drain of the first sleep transistor ST1 may be coupled with the logic circuit 310. The first variable bias voltage ABB1 may be applied to the body of the first sleep transistor ST1, and the first variable gate voltage AVS1 may be applied to the gate of the first sleep transistor ST1.

The second sleep transistor ST2 may be coupled between a second power supply voltage VSS and the logic circuit 310. The second power supply voltage VSS may be a low voltage. For example, the second power supply voltage VSS may be a ground voltage. The second sleep transistor ST2 may be an N-channel MOS transistor. The drain of the second sleep transistor ST2 may be coupled with the logic circuit 310, and the source of the second sleep transistor ST2 may be coupled with the second power supply voltage VSS. The second variable bias voltage ABB2 may be applied to the body of the second sleep transistor ST2, and the second variable gate voltage AVS2 may be applied to the gate of the second sleep transistor ST2.

The semiconductor apparatus 100 may include the logic circuit 310 which is configured by a plurality of transistors and the power gating circuit 111. In the case where degradation such as BTI occurs in the semiconductor apparatus 100, the threshold voltages of the first and second sleep transistors ST1 and ST2 which configure the power gating circuit 111 may increase. During the standby operation of the semiconductor apparatus 100, the first and second sleep transistors ST1 and ST2 may be turned off based on the first and second variable bias voltages ABB1 and ABB2 and the first and second variable gate voltages AVS1 and AVS2, thereby reducing the power consumed in the semiconductor apparatus 100. However, since the first and second sleep transistors ST1 and ST2 are turned on for a long time during the active operation of the semiconductor apparatus 100, BTI may occur. If the threshold voltages of the first and second sleep transistors ST1 and ST2 increase due to the BTI, the driving forces of the first and second sleep transistors ST1 and ST2 may be reduced, and a delay by the first and second sleep transistors ST1 and ST2 may occur. Hence, the degradation detection circuit 120 may detect a degradation occurred in the semiconductor apparatus 100 and generate the degradation information DI<0:n> corresponding to the occurred degradation. The voltage generator 130 may change the levels of the first and second variable bias voltages ABB1 and ABB2 and the first and second variable gate voltages AVS1 and AVS2 based on the degradation information DI<0:n>, thereby compensating for variations in the threshold voltages of the first and second sleep transistors ST1 and ST2. The levels of the first and second variable bias voltages ABB1 and ABB2 generated by the voltage generator 130 according to the degradation information DI<0:n> may be changed prior to the levels of the first and second variable gate voltages AVS1 and AVS2. Also, a unit amount of change of the first and second variable bias voltages ABB1 and ABB2 may be larger than a unit amount of change of the first and second variable gate voltages AVS1 and AVS2. The reason to this resides in that, since the first and second variable gate voltages AVS1 and AVS2 are applied to the gates of the first and second sleep transistors ST1 and ST2, in the case where the voltage levels thereof are changed, the gate oxides of the first and second sleep transistors ST1 and ST2 (in particular, the first sleep transistor ST1) may be broken down. In comparison with this, changes in the voltages of the first and second variable bias voltages ABB1 and ABB2 to be applied to the bodies of the first and second sleep transistors ST1 and ST2 may efficiently compensate for variations in the threshold voltages of the first and second sleep transistors ST1 and ST2.

Therefore, the first and second variable bias voltages ABB1 and ABB2 may be controlled prior to the first and second variable gate voltages AVS1 and AVS2.

Figure 4:
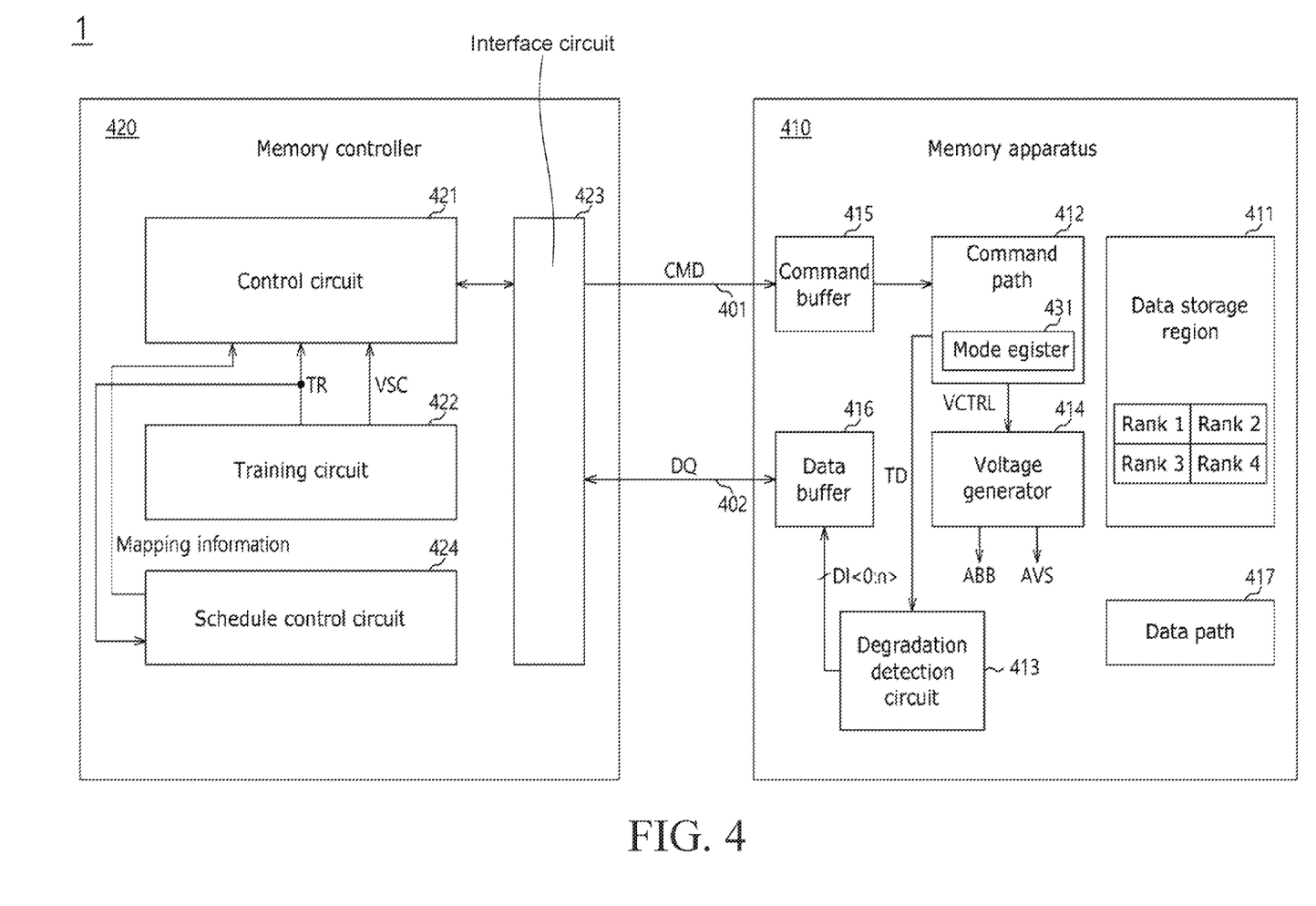
FIG. 4 is a diagram illustrating a representation of an example of the configuration of a semiconductor system in accordance with an embodiment.

FIG. 4 is a diagram illustrating a representation of an example of the configuration of a semiconductor system 1 in accordance with an embodiment. Referring to FIG. 4, the semiconductor system 1 may include a memory apparatus 410 and a memory controller 420. The memory apparatus 410 may perform various operations by communicating with the memory controller 420. The memory controller 420 may control entry and exit of the memory apparatus 410 to and from an active operation and a standby operation. Further, the memory apparatus 410 may perform data input and output (input/output) operations of storing data transmitted from the memory controller 420 or outputting stored data to the memory controller 420, by being controlled by the memory controller 420. For example, an operation in which data is transmitted from the memory controller 420 and is stored in the memory apparatus 410 may be a write operation, and an operation in which data stored in the memory apparatus 410 is outputted to the memory controller 420 may be a read operation. The write operation and the read operation may be normal operations. The memory controller 420 may provide various control signals to the memory apparatus 410. For example, the memory controller 420 may provide a command CMD, an address signal, a clock signal and data DQ. The memory controller 420 and the memory apparatus 410 may be coupled through a plurality of buses. Referring to FIG. 4, the plurality of buses may include a command bus 401 through which the command CMD is transmitted and a data bus 402 through which the data DQ is transmitted. The command bus 401 may be a unidirectional bus, and the data bus 402 may be a bidirectional bus. While not illustrated, the plurality of buses may further include an address bus through which the address signal is transmitted and a clock bus through which the clock signal is transmitted. The memory controller 420 may provide the command CMD to control entry to and exit from the active operation and standby operation of the memory apparatus 410. The memory controller 420 may transmit a specific command CMD to the memory apparatus 410 to cause the active operation to be performed. The specific command CMD for causing the active operation to be performed may be an active command. The memory controller 420 may transmit a specific command CMD to the memory apparatus 410 to cause the standby operation to be performed. The specific command CMD for causing the standby operation to be performed may be a standby command. The memory controller 420 may transmit a specific command CMD to the memory apparatus 410 to cause the write operation and the read operation to be performed. The specific command CMD for causing the write operation and the read operation to be performed may be a normal command, and may include a write command and a read command. Further, the memory controller 420 may perform a training operation with the memory apparatus 410. The memory controller 420 transmits a specific command CMD to the memory apparatus 410 to cause the memory apparatus 410 to perform the training operation. The specific command CMD for causing the training operation to be performed may be a training command.

The memory apparatus 410 may detect a degradation occurred in the memory apparatus 410 based on the training command transmitted from the memory controller 420. The memory apparatus 410 may generate degradation information DI<0:n> by detecting a degradation occurred in the memory apparatus 410. The memory apparatus 410 may output the degradation information DI<0:n> to the memory controller 420. Referring to FIG. 4, the memory apparatus 410 may include a data storage region 411, a command path 412, a degradation detection circuit 413 and a voltage generator 414. The data storage region 411 as a region where the data DQ transmitted from the memory controller 420 may be stored may include a plurality of memory cells. The command path 412 may receive various commands CMD which are transmitted from the memory controller 420, and generate internal command signals. The command path 412 may generate a degradation detection signal TD as an internal command signal when the training command is received. While not illustrated, the command path 412 may generate various internal command signals based on the commands CMD which are transmitted from the memory controller 420. For example, the active signal ACT and the standby signal SB illustrated in FIG. 1 may be generated based the active command and the standby command. Moreover, a write signal and a read signal may be generated based on the write command and the read command. The command path 412 may include a decoding circuit for decoding the command CMD transmitted from the memory controller 420 and a mode register 431. The mode register 431 may store various information related with the operations of the memory apparatus 410. For example, the mode register 431 may store information related with setting of the levels of various voltages to be used in the memory apparatus 410. As will be described later, the memory controller 420 may transmit a specific command CMD for the voltage level setting, and the specific command CMD may be a voltage setting command. The command path 412 may generate a voltage control signal VCTRL based on the voltage setting command, and the voltage control signal VCTRL may be stored in the mode register 431 and be provided to the voltage generator 414.

The degradation detection circuit 413 may detect a degradation occurred in the memory apparatus 410, based on the degradation detection signal TD. The degradation detection circuit 413 may generate the degradation information DI<0:n> by detecting a degradation occurred in the memory apparatus 410. The voltage generator 414 may generate a variable bias voltage ABB and a variable gate voltage AVS based on the voltage control signal VCTRL. The voltage generator 414 may change the levels of the variable bias voltage ABB and the variable gate voltage AVS based on the voltage control signal VCTRL. The degradation detection circuit 120 illustrated in FIGS. 1 and 2 may be applied as the degradation detection circuit 413. In the same manner as the degradation detection circuit 120, the degradation detection circuit 413 may include the degradation-insensitive delay path 210, the degradation-sensitive delay path 220, the detector 230 and the pulse generator 240. The degradation-insensitive delay path 210 of the degradation detection circuit 413 may be turned on when both the standby signal SB and the degradation detection signal TD are enabled. For example, the degradation-insensitive delay path 210 may be turned on based on an output which is obtained by ANDing or performing an AND logical operation on the standby signal SB and the degradation detection signal TD. In the same manner, the pulse generator 240 may also be turned on when both the standby signal SB and the degradation detection signal TD are enabled.

The memory apparatus 410 may further include a command buffer 415, a data buffer 416 and a data path 417. The command buffer 415 may be coupled with the command bus 401 and receive the command CMD transmitted from the memory controller 420. The command buffer 415 may buffer the received command CMD and provide the buffered command to the command path 412. The data buffer 416 may be coupled with the data bus 402, and may receive the data DQ transmitted from the memory controller 420 and transmit is the data DQ outputted from the memory apparatus 410, to the memory controller 420 through the data bus 402. The data buffer 416 may include a receiver for receiving data DQ transmitted from the memory controller 420 and a transmitter for transmitting data DQ to the memory controller 420. The data buffer 416 may receive the degradation information DI<0:n> from the degradation detection circuit 413. The data buffer 416 may transmit the degradation information DI<0:n> to the memory controller 420 through the data bus 402. The data path 417 may include any data input/output circuit for storing data received through the data buffer 416, in the data storage region 411, or outputting data stored in the data storage region 411, to the data buffer 416. At least one among the components of the memory apparatus 410 may correspond to the circuit block 110 illustrated in FIG. 1. For example, the data path 417 may correspond to the circuit block 110, and may include a power gating circuit. The power gating circuit may be applied with the variable bias voltage ABB and the variable gate voltage AVS and reduce power to be consumed in the data path 417.

Referring to FIG. 4, the memory controller 420 may include a control circuit 421 and a training circuit 422. The control circuit 421 may generate various control signals such that the memory apparatus 410 may perform various operations. The control circuit 421 may transmit the command CMD and the data DQ to the memory apparatus 410 based on a request applied from an external apparatus such as a host. In addition, the control circuit 421 may generate the training command based on a training signal TR and transmit the training command to the memory apparatus 410. The control circuit 421 may generate the voltage setting command based on a voltage setting control signal VSC and transmit the voltage setting command to the memory apparatus 410. The control circuit 421 may be embodied by a circuit such as a state machine. The training circuit 422 may include any circuit for performing a training operation with the memory apparatus 410. The training circuit 422 may generate the training signal TR to perform the training operation when the training operation is necessary. The training circuit 422 may receive the degradation information DI<0:n> from the memory apparatus 410. The training circuit 422 may generate the voltage setting control signal VSC based on the degradation information DI<0:n>. The training circuit 422 may compare the degradation information DI<0:n> with a reference value, and may generate the voltage setting control signal VSC depending on a comparison result such that the levels of the variable bias voltage ABB and the variable gate voltage AVS may be controlled in the memory apparatus 410. The reference value may be set to determine the degree of a degradation occurred in the memory apparatus 410.

The memory controller 420 may further include an interface circuit 423. The interface circuit 423 may be coupled with the command bus 401 and the data bus 402. The interface circuit 423 may transmit the command CMD and the data DQ to the memory apparatus 410 or receive the data DQ from the memory apparatus 410. The interface circuit 423 may be a physical layer (PHY) for communicating with the memory apparatus 410.

Figure 5:
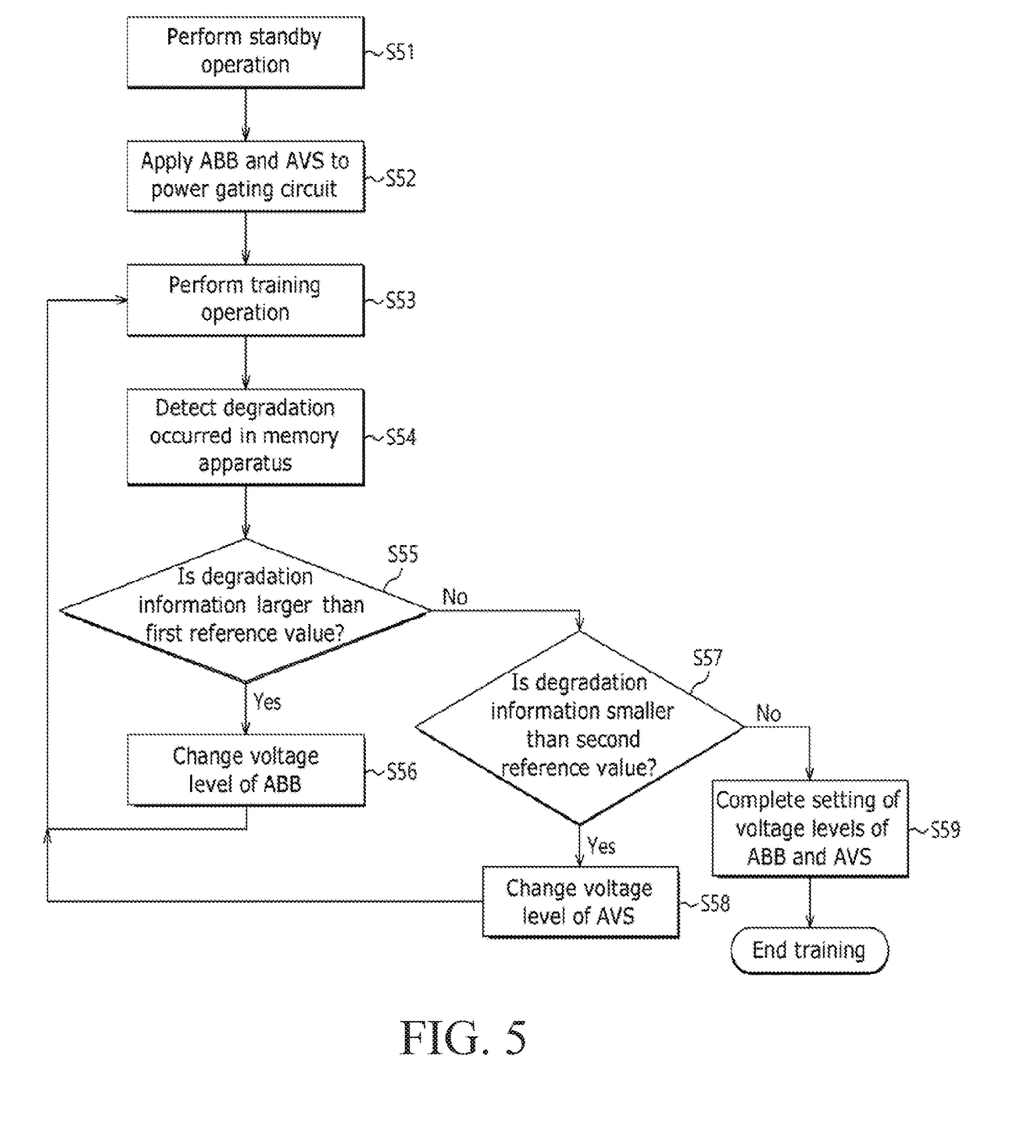
FIG. 5 is a representation of an example of a flow chart to assist in the explanation of the operation of the semiconductor system in accordance with an embodiment.

FIG. 5 is a representation of an example of a flow chart to assist in the explanation of the operation of the semiconductor system in accordance with an embodiment. The operation of the semiconductor system 1 in accordance with an embodiment will be described below with reference to FIGS. 4 and 5. While the memory apparatus 410 performs an active operation, in order to cause a training operation to be performed, the memory controller 420 may control the memory apparatus 410 to perform a standby operation. The control circuit 421 may transmit a standby command to the memory apparatus 410, and the memory apparatus 410 may enter the standby operation based on the standby command (S51). The voltage generator 414 may generate the variable bias voltage ABB and the variable gate voltage AVS based on the voltage control signal VCTRL stored in the mode register 431. The voltage control signal VCTRL stored in the mode register 431 may be a default value. The variable bias voltage ABB and the variable gate voltage AVS may be applied to the power gating circuit 111 as illustrated in FIG. 3 (S52).

The training circuit 422 may generate the training signal TR, and the control circuit 421 may transmit a training command to the memory apparatus 410 based on the training signal TR (S53). The command path 412 may generate the degradation detection signal TD based on the training command, and the degradation detection circuit 413 may detect a degradation occurred in the memory apparatus 410 based on the degradation detection signal TD (S54). The degradation detection circuit 413 may generate the degradation information DI<0:n> by detecting a degradation occurred in the memory apparatus 410 and transmit the degradation information DI<0:n> to the memory controller 420 through the data buffer 416.

The training circuit 422 may monitor the degradation information DI<0:n> transmitted from the memory apparatus 410. The training circuit 422 may perform the training operation for changing the levels of the variable bias voltage ABB and the variable gate voltage AVS, through two steps. For example, the training circuit 422 may perform the training operation such that the level of the variable bias voltage ABB is set first, and may then perform the training operation such that the level of the variable gate voltage AVS is set. As described above, because the variable bias voltage ABB may be changed prior to the variable gate voltage AVS and a unit amount of change of the variable gate voltage AVS is smaller than a unit amount of change of the variable bias voltage ABB, the step of setting the level of the variable bias voltage ABB may be a coarse tuning step, and the step of setting the level of the variable gate voltage AVS may be a fine tuning step.

The training circuit 422 may perform an operation for first setting the level of the variable bias voltage ABB. It is assumed that the degradation information DI<0:n> having a high value is generated as the degradation of the memory apparatus 410 is serious. The training circuit 422 may determine whether the degradation information DI<0:n> is greater than a first reference value (S55). When the degradation information DI<0:n> is greater than the first reference value, the voltage setting control signal VSC may be generated such that the level of the variable bias voltage ABB may be changed. The control circuit 421 may generate a voltage setting command based on the voltage setting control signal VSC and transmit the voltage setting command to the memory apparatus 410. The command path 412 may generate the voltage control signal VCTRL based on the voltage setting command, and the voltage generator 414 may change the level of the variable bias voltage ABB based on the voltage control signal VCTRL (S56). The training circuit 422 may generate again the training signal TR, and the steps S53, S54, S55 and S56 may be repeatedly performed until the degradation information DI<0:n> becomes smaller than the first reference value.

When the degradation information DI<0:n> is smaller than the first reference value, the training circuit 422 may perform an operation for setting the level of the variable gate voltage AVS. The training circuit 422 may determine whether the degradation information DI<0:n> is smaller than a second reference value (S57). When the degradation information DI<0:n> is smaller than the second reference value, the training circuit 422 may generate the voltage setting control signal VSC such that the level of the variable gate voltage AVS may be changed. The training circuit 422 may generate the voltage setting control signal VSC such that the degradation information DI<0:n> is smaller than the first reference value and is greater than the second reference value. The control circuit 421 may generate a voltage setting command based on the voltage setting control signal VSC and transmit the voltage setting command to the memory apparatus 410. The command path 412 may generate the voltage control signal VCTRL based on the voltage setting command, and the voltage generator 414 may change the level of the variable gate voltage AVS based on the voltage control signal VCTRL (S58). The training circuit 422 may generate again the training signal TR, and the steps S53, S54, S55, S57 and S58 may be repeatedly performed until the degradation information DI<0:n> becomes greater than the second reference value.

When the degradation information DI<0:n> becomes greater than the second reference value, level setting of the variable bias voltage ABB and the variable gate voltage AVS may be completed (S59). When the degradation information DI<0:n> becomes smaller than the second reference value, the voltage control signal VCTRL generated by the voltage setting command corresponding to the voltage setting control signal VSC may be stored in the mode register 431, and the training operation may be ended.

Referring to FIG. 4, the memory apparatus 410 may include a plurality of ranks. The memory apparatus 410 may operate by being divided into the plurality of ranks. The respective ranks may perform data input/output operations independently of one another. Referring to FIG. 4, the memory apparatus 410 may operate by being divided into, for example, first to fourth ranks, but it is not intended that the number of ranks be specifically limited. The data storage region 411 of the memory apparatus 410 may include a plurality of memory banks, and each of the first to fourth ranks may include at least one memory bank. The degradation detection circuit 413 may generate the degradation information DI<0:n> related with the first to fourth ranks. That is to say, the degradation detection circuit 413 may detect individually degradations occurred in the first to fourth ranks, and independently generate the degradation information of the first rank, the degradation information of the second rank, the degradation information of the third rank and the degradation information of the fourth rank. In an embodiment, the memory apparatus 410 may include a plurality of degradation detection circuits 413 which generate the degradation informations related with the first to fourth ranks, respectively. While not illustrated, the memory apparatus 410 may be a stacked memory apparatus including a plurality of memory chips, and at least one memory chip may configure one rank. Each of the plurality of memory chips may include the data storage region 411, the command path 412, the degradation detection circuit 413, the voltage generator 414, the command buffer 415, the data buffer 416 and the data path 417.

The memory controller 420 may perform memory mapping based on the degradation information DI<0:n>. The memory controller 420 may map a rank which is degraded more than the reference value to a rank which is degraded less than the reference value, based on the degradation information DI<0:n>. The memory controller 420 may control the rank which is degraded less than the reference value, to perform a normal operation, in place of the rank which is degraded more than the reference value. The memory controller 420 may further include a schedule control circuit 424. The schedule control circuit 424 may schedule operations of the respective ranks by receiving the training signal TR and the degradation information DI<0:n>. The schedule control circuit 424 may receive the degradation information DI<0:n> for the respective ranks from the degradation detection circuit 413 during the training operation, and may perform a logic calculation for the degradation information DI<0:n>. For example, the schedule control circuit 424 may calculate the average of the degradation information of the first to fourth ranks, and may specify a rank of which degradation is serious, among the first to fourth ranks. For example, the schedule control circuit 424 may determine whether there exists a rank of which deviation in degradation information is greater than the reference value among the degradation information of the first to fourth ranks, and may specify a rank of which deviation is greater than the reference value, as a rank of which degradation is serious. The schedule control circuit 424 may map a rank of which degradation is serious, to a rank of which degradation is small. The memory controller 420 may provide normal commands such that the first to fourth ranks perform data input/output operations. The schedule control circuit 424 may control a normal command to be transmitted to a rank of which degradation is serious among the first to fourth ranks, to be transmitted to a rank of which degradation is not serious among the first to fourth ranks. For example, in the case where the degradation of the first rank is serious, the schedule control circuit 424 may map ranks such that any one among the second to fourth ranks may perform a normal operation in place of the first rank, and may provide a mapping information to the control circuit 421. For example, in order to control the first rank to perform a write operation, the control circuit 421 may provide a rank select signal for selecting the first rank and a write command to the memory apparatus 410. In this regard, in the case where the degradation of the first rank is serious, the control circuit 421 may provide a rank select signal for selecting any one among the second to fourth ranks in place of the first rank and a write command to the memory apparatus 410, based on the mapping information.

Figure 6:
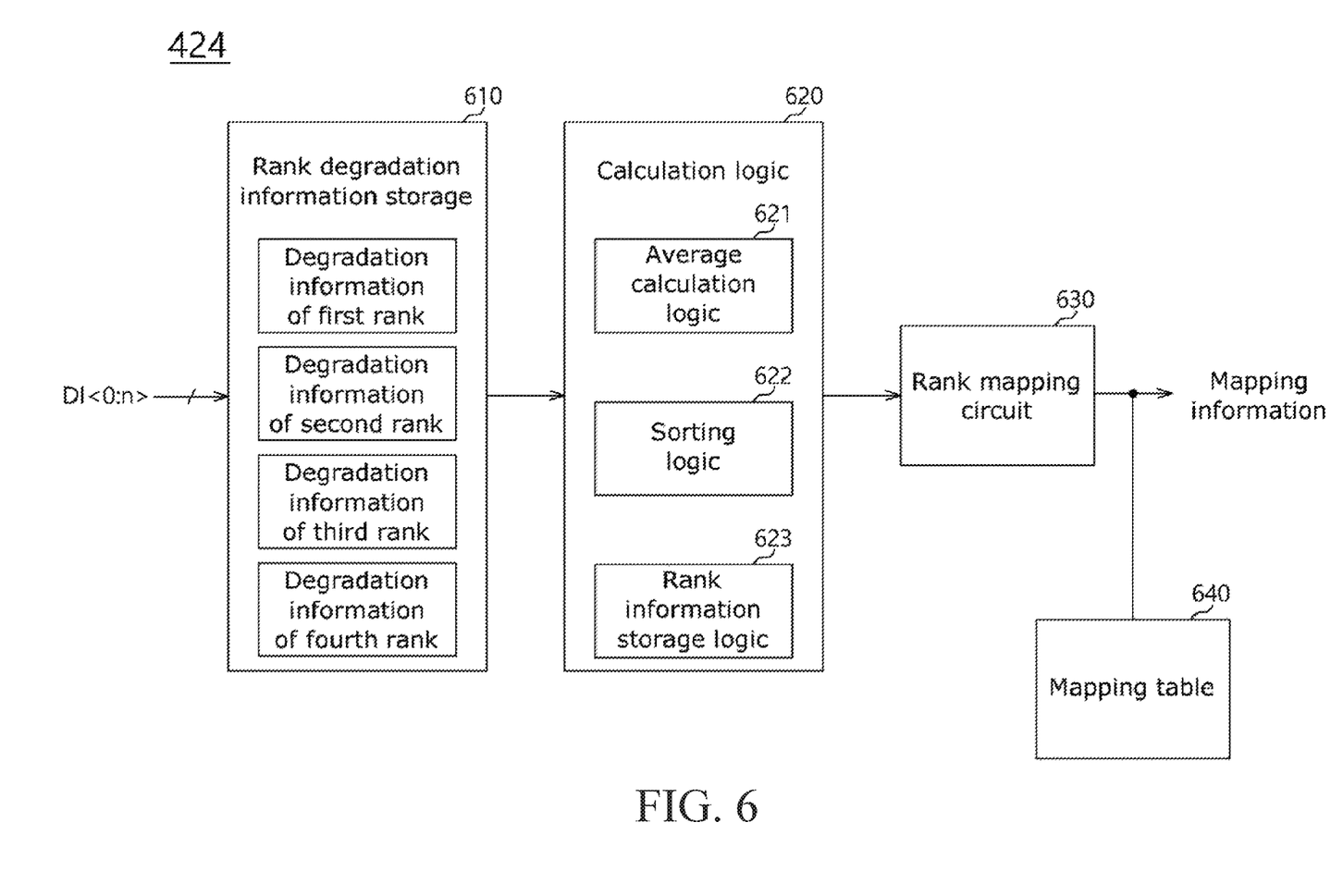
FIG. 6 is a diagram illustrating a representation of an example of the configuration of the schedule control circuit illustrated in FIG. 4.

FIG. 6 is a diagram illustrating a representation of an example of the configuration of the schedule control circuit 424 illustrated in FIG. 4. Referring to FIG. 6, the schedule control circuit 424 may include a rank degradation information storage 610, a calculation logic 620, a rank mapping circuit 630 and a mapping table 640. The rank degradation information storage 610 may store the degradation information DI<0:n> transmitted from the memory apparatus 410. The rank degradation information storage 610 may store individually the degradation information of the first to fourth ranks. The rank degradation information storage 610 may be embodied by a general register circuit. The calculation logic 620 may calculate the average of the degradation information of the first to fourth ranks. The calculation logic 620 may sort a rank having degradation information of which a deviation is greater than the reference value, by using the average. The calculation logic 620 may store the information of a sorted rank. The calculation logic 620 may include an average calculation logic 621, a sorting logic 622 and a rank information storage logic 623. The average calculation logic 621 may calculate the average of the degradation information of the first to fourth ranks. The sorting logic 622 may compare the average and the degradation information of the first to fourth ranks, and may sort a rank having degradation information of which a deviation is greater than the reference value among the degradation information of the first to fourth ranks. The rank information storage logic 623 may store information on a rank having degradation information of which a deviation is greater than the reference value. The rank mapping circuit 630 may map a rank which is sorted as a rank having degradation information of which a deviation is greater than the reference value and is stored in the rank information storage logic 623, with another rank. In other words, the rank mapping circuit 630 may map a rank of which degradation is serious, to a rank of which degradation is small or insignificant. The rank mapping circuit 630 may generate mapping information by performing a mapping operation. The mapping information may be provided to the control circuit 421 and may be stored in the mapping table 640.

Figure 7:
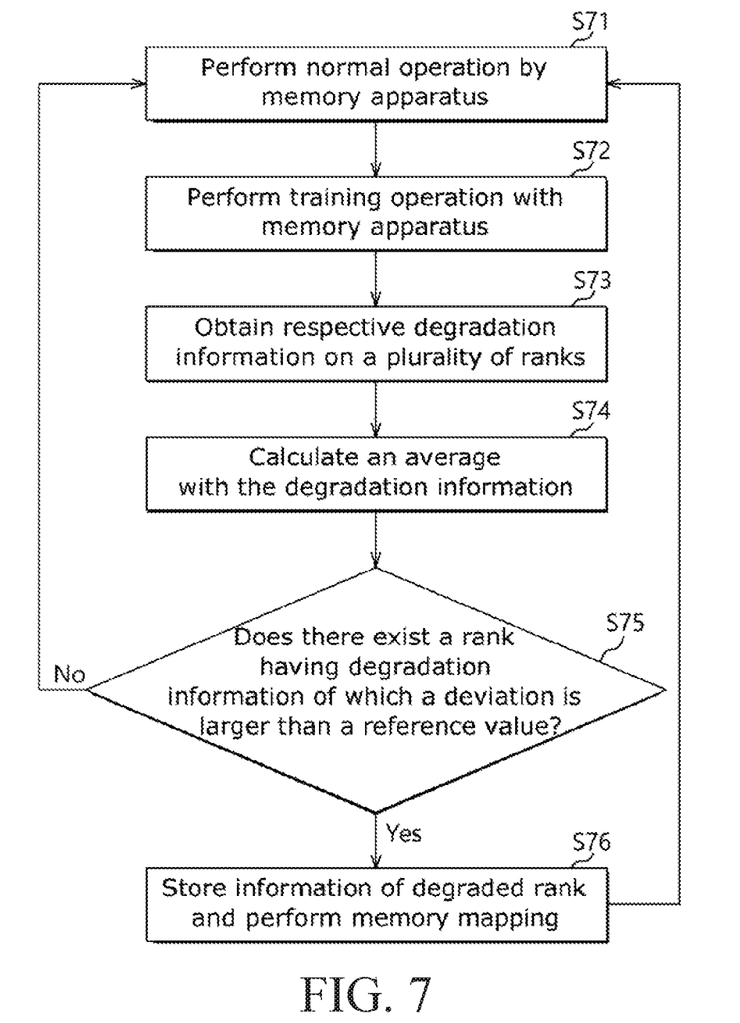
FIG. 7 is a representation of an example of a flow chart to assist in the explanation of another operation of the semiconductor system in accordance with an embodiment.

FIG. 7 is a representation of an example of a flow chart to assist in the explanation of another operation of the semiconductor system 1 in accordance with an embodiment. The operation of the semiconductor system 1 in accordance with an embodiment will be described below with reference to FIGS. 4, 6 and 7. The memory controller 420 may control the memory apparatus 410 to perform a normal operation (S71). The memory controller 420 may perform a training operation with the memory apparatus 410 (S72). The training operation may be performed periodically. In order to perform the training operation with the memory apparatus 410, the memory controller 420 may control the memory apparatus 410 to perform a standby operation. The memory controller 420 may control the memory apparatus 410 to perform the training operation, by providing a training command. The degradation detection circuit 413 of the memory apparatus 410 may detect a degradation that has occurred in the first to fourth ranks, and may generate the degradation information DI<0:n>. The memory apparatus 410 may provide the degradation information DI<0:n> to the schedule control circuit 424. The schedule control circuit 424 may obtain the degradation information of the first to fourth ranks by receiving the degradation information DI<0:n> (S73). The rank degradation information storage 610 of the schedule control circuit 424 may store the respective degradation information of the first to fourth ranks based on the degradation information DI<0:n>. The calculation logic 620 may calculate the average of the degradation information on the first to fourth ranks (S74), and may determine whether there exists a rank having degradation information of which a deviation is greater than the reference value (S75). If a degraded rank does not exist, memory mapping may not be performed, and the memory controller 420 may control the memory apparatus 410 to perform a normal operation.

When assuming that the first rank is degraded most seriously, the sorting logic 622 may sort the first rank having degradation information of which a deviation is greater than the reference value, and may store a sorting result in the rank information storage logic 623. The rank mapping circuit 630 may map the first rank with any one of the second to fourth ranks. For example, the rank mapping circuit 630 may map the first rank with the second rank, may provide mapping information that the first rank is replaced with the second rank, to the control circuit 421, and may store the mapping information in the mapping table 640. Thereafter, when the memory apparatus 410 performs a normal operation, the control circuit 421 may transmit a normal command to be transmitted to the first rank, to the second rank based on the mapping information, and memory mapping may be performed such that a rank of which a degradation is not serious may perform the normal operation in replacement of a rank of which degradation is serious (S76). Therefore, the second rank may perform the normal operation in place of the first rank.

While various embodiments have been described above, it will be understood to those skilled in the art that the embodiments described are examples only. Accordingly, the semiconductor apparatus for compensating for degradation and the semiconductor system using the same described herein should not be limited based on the described embodiments.

What is claimed is:

1. A semiconductor system comprising:
    a memory apparatus configured to detect degradation that has occurred in the memory apparatus and generating degradation information based on a training command, and generate a variable bias voltage and a variable gate voltage based on a voltage setting command; and
    a memory controller configured to provide the training command to the memory apparatus, and generate the voltage setting command based on the degradation information.

2. The semiconductor system according to claim 1, wherein the memory apparatus comprises:
    a command path configured to generate a degradation detection signal based on the training command, and generate a voltage control signal based on the voltage setting command;
    a degradation detection circuit configured to detect a degradation occurred in the memory apparatus based on the degradation detection signal, and generate the degradation information; and
    a voltage generator configured to generate the variable bias voltage and the variable gate voltage based on the voltage control signal.

3. The semiconductor system according to claim 2, wherein the degradation detection circuit comprises:
    a degradation-insensitive delay path configured to delay a pulse signal by a delay amount according to a variation in process, temperature and voltage, and generate a first delayed signal;
    a degradation-sensitive delay path configured to delay the pulse signal by a delay amount according to a variation in process, temperature and voltage and a degradation occurred in the memory apparatus, and generate a second delayed signal; and
    a detector configured to compare a phase difference of the first and second delayed signals, and generate the degradation information.

4. The semiconductor system according to claim 2, wherein the voltage generator changes levels of the variable bias voltage and the variable gate voltage based on the degradation information, and a unit amount of change of the variable gate voltage is smaller than a unit amount of change of the variable bias voltage.

5. The semiconductor system according to claim 2, wherein the degradation detection circuit comprises:
    a degradation-insensitive delay path configured to delay a pulse signal by a first delay amount and generating a first delayed signal;

a degradation-sensitive delay path configured to delay a pulse signal by a second delay amount and generate a second delayed signal;

a detector configured for compare a phase difference of the first and second delayed signals, and generate the degradation information, wherein the first delay amount and the second delay amount are influenced by the degradation of the semiconductor apparatus and the first delay amount is influenced less than the second delay amount is influenced by the degradation of the semiconductor apparatus.

6. The semiconductor system according to claim 2, wherein the memory apparatus further comprises:

a logic circuit; and a power gating circuit including at least one sleep transistor, the first sleep transistor configured to couple a power supply voltage and the logic circuit.

7. The semiconductor system according to claim 6, wherein the variable bias voltage is applied to a body of the sleep transistor, and the variable gate voltage is applied to a gate of the sleep transistor.

8. The semiconductor system according to claim 2, wherein the memory apparatus further comprises:

a data buffer configured to transmit the degradation information to the memory controller.

9. The semiconductor system according to claim 1, wherein the memory controller comprises:

a training circuit configured to generate a training signal to perform a training with the memory apparatus, and generate a voltage setting control signal based on the degradation information; and a control circuit configured to generate the training command based on the training signal, and generate the voltage setting command based on the voltage setting control signal.

10. A semiconductor system comprising:

a memory apparatus including a plurality of ranks, and configured to generate a degradation information by detecting degradation that has occurred in the plurality of ranks based on a training command; and a memory controller configured to perform memory mapping by mapping a rank which is degraded more than a reference among the plurality of ranks with a rank which is degraded less than the reference among the plurality of ranks, based on the degradation information.

11. The semiconductor system according to claim 10, wherein the memory apparatus comprises:

a command path configured to generate a degradation detection signal based on the training command; and a degradation detection circuit configured to generate the degradation information by detecting degradation that has occurred in the plurality of ranks based on the degradation detection signal.

12. The semiconductor system according to claim 11, wherein the degradation detection circuit comprises:

a degradation-insensitive delay path configured to delay a pulse signal by a delay amount according to a variation in process, temperature and voltage, and generating a first delayed signal;

a degradation-sensitive delay path configured to delay the pulse signal by a delay amount according to a variation in process, temperature and voltage and degradation that has occurred in the memory apparatus, and generating a second delayed signal; and a detector configured to compare a phase difference of the first and second delayed signals, and generating the degradation information.

13. The semiconductor system according to claim 12, wherein the degradation detection circuit further comprises:

a pulse generator configured to generate the pulse signal during a standby operation of the semiconductor apparatus.

14. The semiconductor system according to claim 11, wherein the memory apparatus further comprises:

a data buffer configured to output the degradation information to the memory controller.

15. The semiconductor system according to claim 10, wherein the memory controller comprises:

a training circuit configured to generate a training signal to perform a training with the memory apparatus;

a schedule control circuit configured to generate a mapping information by performing a logic calculation based on the degradation information; and a control circuit configured to generate the training command based on the training signal, and transmit a normal command to the memory apparatus based on the mapping information.

16. The semiconductor system according to claim 15, wherein the schedule control circuit comprises:

a rank degradation information storage configured to store degradation information of the plurality of ranks based on the degradation information;

a calculation logic configured to calculate an average of the degradation information of the plurality of ranks, and sort a rank having degradation information of which a deviation is greater than a reference;

a rank mapping circuit configured to map the rank sorted by the calculation logic with another rank, and generate the mapping information; and a mapping table configured to store the mapping information.

17. The semiconductor system according to claim 16, wherein the calculation logic comprises:

an average calculation logic configured to calculate the average of the degradation information of the plurality of ranks;

a sorting logic configured to sort a rank having degradation information of which a deviation is greater than the reference; and a rank information storage logic configured to store information on a sorted rank.

* * * * *